United States Patent
Hofheinz

(10) Patent No.: US 9,182,431 B2
(45) Date of Patent: Nov. 10, 2015

(54) METHOD AND APPARATUS FOR DETERMINING AN INSULATION RESISTANCE IN A GROUNDED ISOLE TERRE SYSTEM

(71) Applicant: Wolfgang Hofheinz, Gruenberg (DE)

(72) Inventor: Wolfgang Hofheinz, Gruenberg (DE)

(73) Assignee: BENDER GMBH & CO. KG, Gruenberg (DE)

( * ) Notice: Subject to any disclaimer, the term of this patent is extended or adjusted under 35 U.S.C. 154(b) by 246 days.

(21) Appl. No.: 13/647,193

(22) Filed: Oct. 8, 2012

(65) Prior Publication Data

US 2013/0088240 A1    Apr. 11, 2013

(30) Foreign Application Priority Data

Oct. 10, 2011   (DE) .......................... 10 2011 084 219

(51) Int. Cl.
| | | |
|---|---|---|
| *G01R 31/14* | (2006.01) | |
| *G01R 27/18* | (2006.01) | |
| *G01R 31/02* | (2006.01) | |

(52) U.S. Cl.
CPC .............. *G01R 27/18* (2013.01); *G01R 31/025* (2013.01)

(58) Field of Classification Search
CPC .... G01R 31/025; G01R 27/18; G01R 19/145; B60L 3/0069
USPC ................. 324/508, 509, 512, 541, 544, 551; 361/42
See application file for complete search history.

(56) References Cited

U.S. PATENT DOCUMENTS

| | | | | |
|---|---|---|---|---|
| 4,853,616 A | * | 8/1989 | Gard | 324/557 |
| 6,984,988 B2 | * | 1/2006 | Yamamoto | 324/509 |
| 7,317,316 B2 | * | 1/2008 | Leitz | 324/551 |
| 7,994,799 B2 | * | 8/2011 | Tachizaki | 324/551 |
| 8,294,303 B2 | * | 10/2012 | Eaglesham et al. | 307/112 |
| 8,466,691 B2 | * | 6/2013 | Hernando et al. | 324/551 |
| 8,537,509 B2 | * | 9/2013 | Yoon | 361/42 |
| 8,643,384 B2 | * | 2/2014 | Apfelthaler | 324/551 |
| 2009/0153156 A1 | * | 6/2009 | Ishii | 324/704 |
| 2010/0246081 A1 | * | 9/2010 | Yano et al. | 361/91.5 |
| 2012/0120530 A1 | * | 5/2012 | Yoon | 361/42 |
| 2012/0249038 A1 | * | 10/2012 | Wei et al. | 318/490 |

FOREIGN PATENT DOCUMENTS

| | | |
|---|---|---|
| JP | 09080108 A | 3/1997 |
| JP | 11122819 A | 4/1999 |

* cited by examiner

*Primary Examiner* — Arleen M Vazquez
*Assistant Examiner* — Dominic Hawkins
(74) *Attorney, Agent, or Firm* — Quarles & Brady LLP

(57) ABSTRACT

The invention relates to a method and an apparatus for determining an actual insulation resistance $R_{ISO}$ in IT systems grounded with a functional grounding resistance $R_{HRG}$, comprising constant insulation monitoring. In one embodiment of the invention, the functional grounding resistance $R_{HRG}$ is determined during the initial inspection of the IT system, determining a total insulation resistance $R_{ges}$ is carried out during the constant insulation monitoring, and the actual insulation resistance $R_{ISO}$ is determined during the operation of the IT system from the functional grounding resistance $R_{HRG}$ and the total insulation resistance $R_{ges}$.

10 Claims, 2 Drawing Sheets

METHOD AND APPARATUS FOR DETERMINING AN INSULATION RESISTANCE IN A GROUNDED ISOLE TERRE SYSTEM

CROSS REFERENCE TO RELATED APPLICATION

The present application claims the benefit of German Patent Application No. 10 2011 084 219.5 filed Oct. 10, 2011, which is fully incorporated herein by reference.

STATEMENT REGARDING FEDERALLY SPONSORED RESEARCH OR DEVELOPMENT

Not applicable.

FIELD OF THE INVENTION

The invention relates to a method for determining an actual insulation resistance in Isolé Terre systems grounded with a functional grounding resistance, comprising constant insulation monitoring.

The invention further relates to an electrical apparatus for determining an actual insulation resistance in IT systems grounded with a functional grounding resistance, comprising a device for constant insulation monitoring.

BACKGROUND OF THE INVENTION

In order to ensure high availability and operational reliability of the electrical power supply and to ensure personnel safety in the area of electrical installations, supply networks are increasingly used, the active parts of which are separated from the ground potential. In this type of supply network, designated as ungrounded IT system, an active conductor can have an insulation fault without the need to interrupt the running operation of the installation because due to the ideally infinite impedance value between conductor and ground, no closed circuit can form in this first fault case. An insulation fault is to be understood here as a faulty state of the IT system resulting in the insulation resistance falling below the permissible insulation level. It follows from this view that the resistance in a monitored network, including the resistances against ground (insulation resistance) of all equipment connected thereto, has to be constantly monitored because through a potential further fault at another active conductor (second fault), a fault loop would be generated and the residual current flowing in this case in connection with an overcurrent protection would result in a shut-off of the installation. By means of a constant insulation monitoring of the ungrounded IT system, a falling insulation resistance can be detected at an early stage and can be reported. The operator of the installation thereby gains an information advantage which gives the operator sufficient time to fix the (first) fault and therefore to achieve high availability and operational reliability of the installation.

Besides these ungrounded IT systems, IT systems which are connected to ground through a sufficiently high impedance are also permissible according to the DIN VDE standard 0100-410 (VDE 0100-410):2007-06 or the IEC mirror standard IEC 60364-4-41 in paragraph 411.6. This artificial impedance can also be implemented as ohmic resistance— hereinafter also designated as functional grounding resistance—and can be configured to be high-ohmic or low-ohmic. In the case of a high-ohmic configuration, the functional grounding resistance limits an occurring residual current to a value which does not yet trigger an overcurrent protection.

This type of resistance grounding is internationally also designated as high-resistance grounding (HRG) and has been proposed in the draft standard IEC 60364-7-712:2011 for photovoltaic installations as "functional earthing". Circuitry-wise, due to its arrangement between active conductor and ground, such a functional grounding resistance (HRG resistance) can be represented as a resistor connected in parallel to the actual insulation resistor. Said parallel connection results in a total insulation resistance which is measurable, but does not allow to make any assessment about that portion of the insulation resistance reduction that is caused by a change of the actual insulation resistance, thus caused by a change of the resistance in the monitored network, including the resistances against ground of all equipment connected thereto. An evaluation of the actual insulation status of the installation is therefore only possible through an assessment on the total insulation resistance.

With a differential current monitoring device (RCM) or a residual current device (RCD) connected in series with the HRG resistor, only differential currents can be detected which are based on an asymmetric insulation resistance reduction; a symmetric insulation reduction at active positive and negative poles of a direct current voltage IT network cannot be detected because these appliances do not superimpose an active measuring voltage on the network.

SUMMARY OF THE INVENTION

It is therefore an object of the present invention to propose, in an alternating current voltage or direct current voltage IT system grounded with a functional grounding resistance, a method and an apparatus for improving protection of personnel and equipment which ensure at the same time high availability and operational reliability of the electrical installation.

With regard to a method, this object is achieved in connection with a method for determining an actual insulation resistance $R_{ISO}$ in IT systems grounded with a functional grounding resistance $R_{HRG}$, in that the functional grounding resistance is determined during the initial inspection of the IT system, a determination of a total insulation resistance is carried out during the constant insulation monitoring, and the actual insulation resistance is determined during the operation of the IT system from the functional grounding resistance and the total insulation resistance.

The method steps according to the invention enable for the first time to determine the actual insulation resistance in a grounded IT system and thus allow providing assessments about the insulation level in a grounded IT system which were up to now only possible in ungrounded IT systems. After the functional grounding resistance (HRG resistance) has been determined during the specified initial inspection, the actual insulation resistance can be determined within the constant insulation monitoring by collecting measurements of the total insulation resistance.

Determining the actual insulation resistance $R_{ISO}$ takes place in an advantageous manner according to the relation $R_{ISO}=1/(1/R_{ges}-1/R_{HRG})$, which derives from the parallel connection of the measured functional grounding resistance $R_{HRG}$ with the actual insulation resistance $R_{ISO}$ to the measured total insulation resistance $R_{ges}$. The parallel connection corresponds to the "sum" of the resistances against ground in which, in addition to the actual insulation resistance, the functional grounding resistance $R_{HRG}$ determined during the initial inspection is also included. From the known variables such as grounding resistance $R_{HRG}$ and total insulation resistance $R_{ges}$, the actual insulation resistance $R_{ISO}$ can be calculated.

Also, by determining the actual insulation resistance $R_{ISO}$, symmetric insulation resistance reductions are detected so that the protection against electric shock is further improved. With a differential current monitoring device (RCM)—as an additional safety measure—connected in series with the HRG resistor $R_{HRG}$, symmetric insulation resistance reductions cannot be detected because the residual currents thereof cancel each other out in the summation current transformer of the RCM.

In another advantageous configuration of the method, based on the determined actual insulation resistance $R_{ISO}$, the response levels for reporting an insulation fault and/or for switching off the IT network are set depending on the calculated actual insulation resistance specifically adapted to the installation and according to the operating conditions. Thus, with the actual insulation resistance $R_{ISO}$ as a base value, it is possible to determine the response levels for the insulation monitoring in consideration of the structure of the IT system and the environmental parameters. This qualified insulation monitoring increases the interruption-free running times of the IT system and therefore results in increased availability and efficiency of the installation.

Advantageously, the determined safety-related variables and/or warnings are optically and/or acoustically indicated by means of a signaling device. Thus, the operator of the installation is immediately and comprehensively informed about the safety status of the IT system so that the operator can immediately initiate further measures, if necessary.

In a practical configuration of the method, the method parameters are adapted to the requirements of a photovoltaic installation which is implemented as a grounded direct current voltage IT system. The method according to the invention can be used in all grounded IT systems and, moreover, offers the possibility of an optimal adaptation to the safety-related characteristics of a photovoltaic installation.

With regards to an apparatus, the object underlying the invention is achieved in an electrical apparatus for determining an actual insulation resistance $R_{ISO}$ in an IT system ground with a functional grounding resistance $R_{HRG}$ by a device for determining the functional grounding resistance during an initial inspection of the IT system, and a device for determining the actual insulation resistance from the functional grounding resistance and the total insulation resistance. By including a device for determining the functional grounding resistance, a device for determining the actual insulation resistance, and a device for constant insulation monitoring in one unit, an apparatus is created which allows for the first time to determine the actual insulation resistance in a grounded IT system. The apparatus according to the invention is able, during an initial inspection of the IT system, to determine the functional grounding resistance (HRG resistance) and, during the operation of the IT system, to determine the actual insulation resistance from the collected measurements of the total insulation resistance. Through the determination of the actual insulation resistance, comprehensive assessments about an insulation resistance reduction can also be made in a grounded IT system; in particular, symmetric insulation reductions are also detected. This results in a significant improvement of the protection of personnel and equipment while achieving high availability and operational reliability at the same time.

In a preferred configuration, the apparatus according to the invention comprises a signaling device for optically and/or acoustically indicating the determined safety-related variables and/or warnings. In this manner, the safety-related status of the IT system is immediately and directly visible for the operator of the installation.

As another advantage, the device for constant insulation monitoring, the device for determining the functional grounding resistance during an initial inspection, the device for determining the actual insulation resistance and the signaling device form one unit. Thus, the apparatus consists of a structural unit which comprises all aforementioned devices and which is designed for carrying out all steps of the method according to the invention.

Furthermore, the apparatus according to the invention is designed for the requirements of a photovoltaic installation which is implemented as a grounded direct current voltage IT system. Thus, in addition to the universal use in grounded IT systems, the apparatus can in particular be used for monitoring in photovoltaic installations.

Further advantageous configuration features arise from the following description and the drawings which illustrate a preferred embodiment of the invention by means of examples.

DETAILED DESCRIPTION OF THE EXAMPLE EMBODIMENTS

Figure 1:
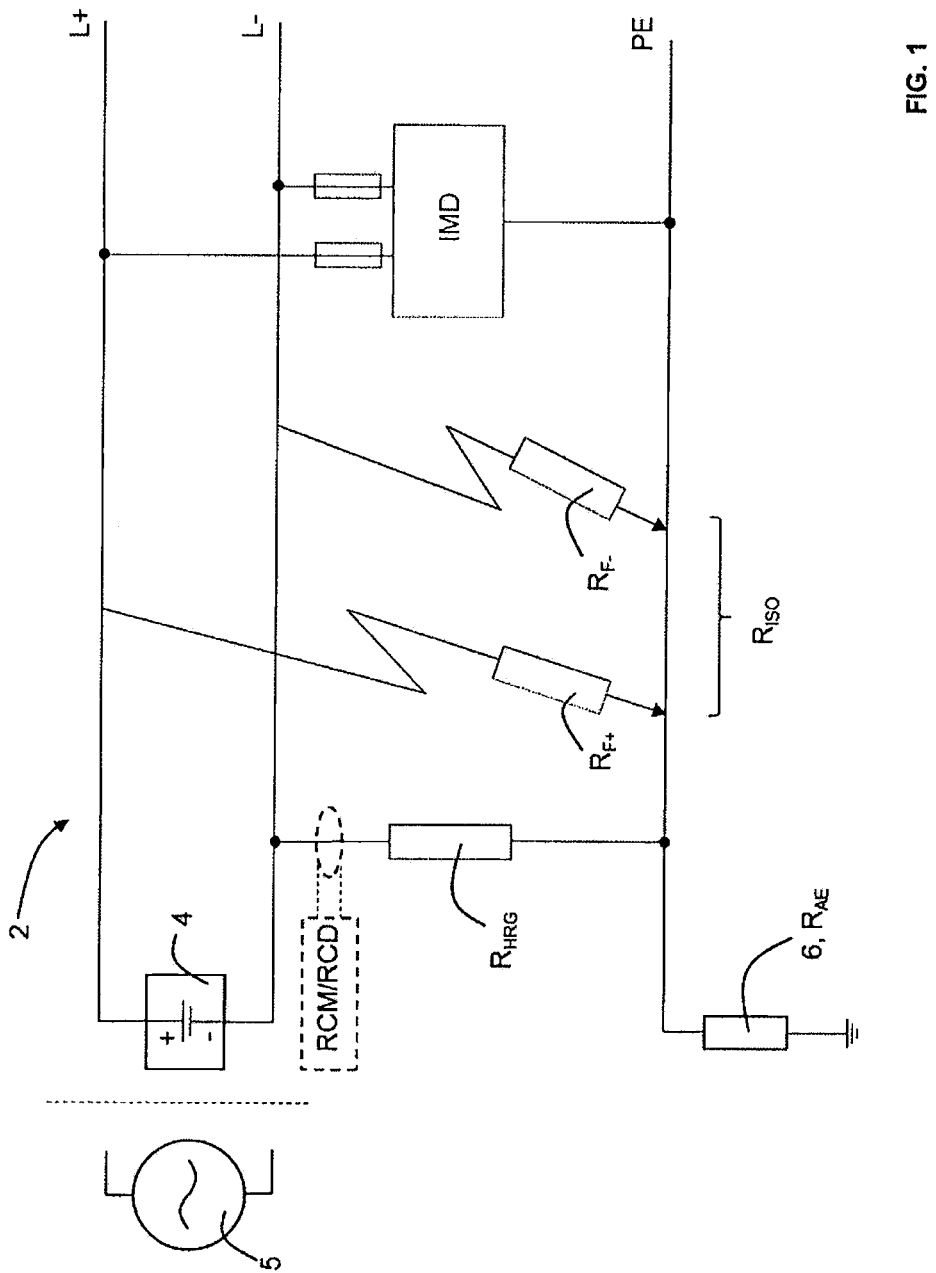
FIG. 1 shows a grounded direct current voltage IT system with insulation monitoring in the case of a fault.

Using the example of a grounded IT system 2, FIG. 1 shows the operating principle of a method for determining an actual insulation resistance $R_{ISO}$. The grounded IT system 2 can be supplied by a direct current voltage source 4 or an alternating current voltage source 5. In the illustrated case of a direct current voltage IT system 2, the IT network 2 consisting of two active L+ and L− conductors is supplied by a direct current voltage generator 4 which, for example, can be a solar field built from solar power modules. For high-ohmic or low-ohmic grounding, the IT system is connected at the negative conductor L− to the protective ground PE via the functional grounding resistor (HRG resistor) $R_{HRG}$. Through a ground electrode 6 with the resistance $R_{AE}$, currents are discharged into the ground earth.

Illustrated is a fault status in which between the active positive conductor L+ and ground and also between the active negative conductor L− and ground, insulation faults $R_{F+}$ and $R_{F-}$, respectively, have occurred which have an (ohmic) resistance.

Figure 2:
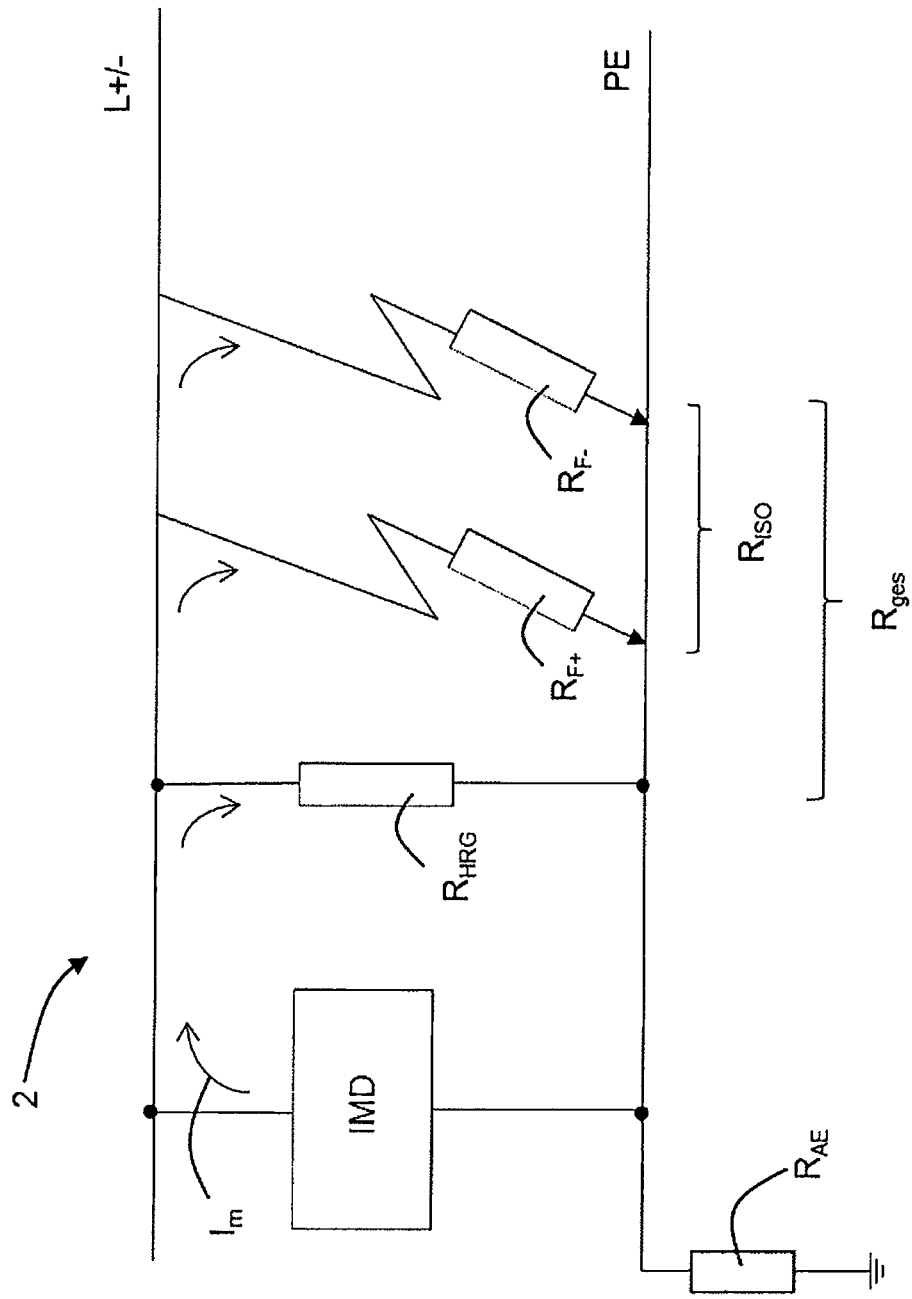
FIG. 2 shows a simplified circuit diagram for determining the actual insulation resistance $R_{ISO}$.

An insulation monitoring device IMD is symmetrically connected between the active conductors L+, L− and protective ground and measures, for example by superimposing a measuring voltage, a total current (measuring current $I_m$, FIG. 2) which is proportional to the total insulation fault, or measures the voltage which drops at a measuring resistor and which is proportional to a total insulation resistance $R_{ges}$ (FIG. 2).

For detecting residual currents in alternating current voltage systems, a differential current monitoring device (RCM) or a residual current device (RCD) can be connected in series to the HRG resistor $R_{HRG}$. This monitoring or protection device does not belong to the invention and serves only for clarifying the fact that with such a device, no symmetric insulation faults can be detected.

The measuring results resulting from the viewed fault constellation and the determination of the actual insulation resistance $R_{ISO}$ are illustrated in more detail in the simplified circuit diagram according to FIG. 2. In this illustration, the active positive and the active negative conductors L+ and L− are combined because their insulation faults $R_{F+}$ and $R_{F-}$ are considered by the insulation monitoring apparatus IMD as a parallel connection of the insulation resistors $R_{F+}$ and $R_{F-}$. This parallel connection reflects the actual insulation status of the IT system 2 and therefore represents the actual insulation resistance $R_{ISO}=1/(1/R_{F+}+1/R_{F-})$ thereof. Due to the further parallel connection of the functional grounding resistor $R_{HRG}$ with the insulation faults $R_{F+}$ and $R_{F-}$, the actual insulation resistance $R_{ISO}$ represents only a partial insulation resistance so that the insulation resistance measurement by the insulation monitoring device IMD results in a total insulation resistance $R_{ges}$ which is composed of the parallel connection of the actual insulation resistor $R_{ISO}$ and the functional grounding resistor $R_{HRG}$ according to $R_{ges}=1/(1/R_{ISO}+1/R_{HRG})$.

With the knowledge of the measured total insulation resistance $R_{ges}$ and the functional grounding resistance $R_{HRG}$ determined during an initial inspection of the system, then, the determination of the actual insulation resistance $R_{ISO}$ follows by calculating according to the relation $R_{ISO}=1/(1/R_{ges}-1/R_{HRG}) \Longleftrightarrow R_{ISO}=(R_{ges} \cdot R_{HRG})/(R_{HRG}-R_{ges})$.

The invention claimed is:

1. A method for determining an actual insulation resistance $R_{ISO}$ in isolated ground systems grounded with a functional grounding resistance $R_{HRG}$, said method comprising:
   determining a functional grounding resistance $R_{HRG}$ of an isolated ground system during an initial inspection of the isolated ground system;
   determining a total insulation resistance $R_{ges}$ during constant insulation monitoring; and
   determining an actual insulation resistance $R_{ISO}$ from the functional grounding resistance $R_{HRG}$ and the total insulation resistance $R_{ges}$ during operation of the isolated ground system.

2. The method according to claim 1, in which determining the actual insulation resistance $R_{ISO}$ is carried out according to the relation $R_{ISO}=1/(1/R_{ges}-1/R_{HRG})$, which derives from a parallel connection of the measured functional grounding resistance $R_{HRG}$ with the actual insulation resistance $R_{ISO}$ to the measured total insulation resistance $R_{ges}$.

3. The method according to claim 1, in which by determining the actual insulation resistance $R_{ISO}$, symmetric insulation resistance reductions are also detected.

4. The method according to claim 1, in which based on the determined actual insulation resistance $R_{ISO}$, response levels for reporting an insulation fault and/or for switching off the isolated ground system are set depending on the calculated actual insulation resistance $R_{ISO}$ specifically adapted to the installation and according to the operating conditions.

5. The method according to claim 1, in which predetermined safety-related variables and/or warnings are optically and/or acoustically indicated by means of a signalling device.

6. The method according to claim 1, including adapting method parameters to the requirements of a photovoltaic installation implemented as a grounded direct current voltage isolated ground system.

7. An electrical apparatus for determining an actual insulation resistance $R_{ISO}$ in an isolated ground system ground with a functional grounding resistance $R_{HRG}$, said electrical apparatus comprising:
   a device constantly monitoring insulation of an isolated ground system;
   a device determining functional grounding resistance $R_{HRG}$ of the isolated ground system during an initial inspection of the isolated ground system; and
   a device determining an actual insulation resistance $R_{ISO}$ from the functional grounding resistance $R_{HRG}$ and the total insulation resistance $R_{ges}$.

8. The apparatus according to claim 7, including a signalling device optically and/or acoustically indicating predetermined safety-related variables and/or warnings.

9. The apparatus according to claim 8, in which the device constantly monitoring insulation, the device determining the functional grounding resistance $R_{HRG}$ during an initial inspection, the device determining the actual insulation resistance $R_{ISO}$, and the signalling device form one unit.

10. The apparatus according to claim 7, in which the isolated ground system is a photovoltaic installation implemented as a grounded direct current voltage isolated ground system.

* * * * *